(12) United States Patent
Ogura et al.

(10) Patent No.: US 11,124,703 B2
(45) Date of Patent: Sep. 21, 2021

(54) QUANTUM DOT AND METHOD OF PRODUCING THE SAME; AND WAVELENGTH CONVERTING MEMBER, LIGHTING MEMBER, BACK LIGHT UNIT, AND DISPLAY DEVICE USING QUANTUM DOT

(71) Applicant: NS MATERIALS INC., Fukuoka (JP)

(72) Inventors: Yuko Ogura, Fukuoka (JP); Yuka Takamizuma, Fukuoka (JP); Kazunori Iida, Fukuoka (JP); Emi Tsutsumi, Fukuoka (JP); Masanori Tanaka, Fukuoka (JP); Soichiro Nikata, Fukuoka (JP)

(73) Assignee: NS MATERIALS INC., Fukuoka (JP)

( * ) Notice: Subject to any disclaimer, the term of this patent is extended or adjusted under 35 U.S.C. 154(b) by 0 days.

(21) Appl. No.: 16/754,578

(22) PCT Filed: Oct. 12, 2018

(86) PCT No.: PCT/JP2018/038038
§ 371 (c)(1),
(2) Date: Apr. 8, 2020

(87) PCT Pub. No.: WO2019/074083
PCT Pub. Date: Apr. 18, 2019

(65) Prior Publication Data
US 2020/0347296 A1    Nov. 5, 2020

(30) Foreign Application Priority Data

Oct. 12, 2017  (JP) .............................. JP2017-198667

(51) Int. Cl.
*C09K 11/88* (2006.01)
*C09K 11/56* (2006.01)
(Continued)

(52) U.S. Cl.
CPC .......... *C09K 11/883* (2013.01); *C09K 11/025* (2013.01); *F21V 9/30* (2018.02); *B82Y 20/00* (2013.01); *B82Y 40/00* (2013.01)

(58) Field of Classification Search
CPC .... C09K 11/565; C09K 11/584; C09K 11/883
See application file for complete search history.

(56) References Cited

U.S. PATENT DOCUMENTS

| 6,251,303 B1 | 6/2001 | Bawendi et al. |
| 2009/0108235 A1 | 4/2009 | Ando et al. |
(Continued)

FOREIGN PATENT DOCUMENTS

| CN | 106479481 | 3/2017 |
| CN | 106544003 | 3/2017 |
(Continued)

OTHER PUBLICATIONS

Khan. Emission-wavelength-dependent photoluminescence decay lifetime of N-functionalized graphene quantum dot downconverters: Impact on conversion efficiency of Cu(In, Ga)Se2 solar cells. Scientific Reports vol. 9, Article No. 10803 (2019) (Year: 2019).*

(Continued)

*Primary Examiner* — Matthew E. Hoban
(74) *Attorney, Agent, or Firm* — Greenblum & Bernstein P.L.C.

(57) ABSTRACT

Provided is a Cd-free blue fluorescent quantum dot with a narrow fluorescence FWHM. The quantum dot does not contain cadmium and its fluorescence FWHIM is 25 nm or less. The quantum dot is preferably a nanocrystal containing zinc and selenium or zinc and selenium and sulfur. Further, the quantum dot preferably has a core-shell structure in which the nanocrystal serves as a core and the surface of the core is coated with a shell.

9 Claims, 8 Drawing Sheets

(51) Int. Cl.
*C09K 11/58* (2006.01)
*F21V 9/30* (2018.01)
*C09K 11/02* (2006.01)
*B82Y 20/00* (2011.01)
*B82Y 40/00* (2011.01)

(56) References Cited

U.S. PATENT DOCUMENTS

| | | | |
|---|---|---|---|
| 2009/0159849 A1 | 6/2009 | Uehara et al. | |
| 2015/0299567 A1* | 10/2015 | McDaniel | C09K 11/881 |
| | | | 252/301.6 S |
| 2017/0066965 A1 | 3/2017 | Truskier et al. | |
| 2018/0291268 A1 | 10/2018 | Nam et al. | |

FOREIGN PATENT DOCUMENTS

| | | |
|---|---|---|
| CN | 106753381 | 5/2017 |
| CN | 107573923 | 1/2018 |
| JP | 2002-525394 | 8/2002 |
| JP | 2002-338961 | 11/2002 |
| JP | 2006-291175 | 10/2006 |
| JP | 2016-177220 | 10/2016 |
| KR | 10-2018-0128540 | 12/2018 |
| WO | 2006/120895 | 11/2006 |
| WO | 2007/034877 | 3/2007 |
| WO | 2007/060889 | 5/2007 |
| WO | 2009/034777 | 3/2009 |
| WO | 2016/151933 | 9/2016 |
| WO | 2017/067451 | 4/2017 |
| WO | 2017/086362 | 5/2017 |

OTHER PUBLICATIONS

Macdonald. Cation Exchange of Aqueous CuInS2 Quantum Dots. J. Name., 2013, 00, 1-3 | 1 (Year: 2013).*
Li et al., "Blue-UV-Emitting ZnSe(Dot)/ZnS(Rod) Core/Shell Nanocrystals Prepared from CdSe/CdS Nanocrystals by Sequential Cation Exchange", ACS Nano, vol. 6, No. 2, pp. 1637-1647, published online Jan. 27, 2012.
International Search Report issued in International Patent Application No. PCT/JP2018/038038, dated Jan. 8, 2019, along with an English translation thereof.
Fatemeh Mirnajafizadeh et al., "Hydrothermal synthesis of highly luminescent blue-emitting ZnSe(S) quantum dots exhibiting low toxicity", Materials Science and Engineering C 64 (2016), pp. 167-172.
Christian Ippen et al., "ZnSe/ZnS quantum dots as emitting material in blue QD-LEDs with narrow emission peak and wavelength tunability", Organic Electronics 15 (2014), pp. 126-131.
Notification of Reasons for Refusal from Japan Patent Office (JPO) in Japanese Patent Appl. No. 2019-502819, dated Oct. 16, 2019, together with an English language translation.
Extended European Search Report issued in EP Patent Application No. 18865758.9, dated Mar. 4, 2021.

* cited by examiner

QUANTUM DOT AND METHOD OF PRODUCING THE SAME; AND WAVELENGTH CONVERTING MEMBER, LIGHTING MEMBER, BACK LIGHT UNIT, AND DISPLAY DEVICE USING QUANTUM DOT

TECHNICAL FIELD

The present invention relates to quantum dots and a method of producing the same; and a wavelength converting member, a lighting member, a back light unit, and a display device using quantum dots.

BACKGROUND ART

Quantum dots are nanoparticles made of around several hundreds to several thousands of atoms, each having a particle diameter of around several nanometers to several tens of nanometers. Quantum dots are also referred to as fluorescent nanoparticles, semiconductor nanoparticles, or nanocrystals. The emission wavelength of quantum dots can may be variously changed depending on the particle diameter and the composition of the nanoparticles.

Examples of the properties of quantum dots include the fluorescence quantum yield (QY) and the full width at half maximum (FWHM) of the fluorescence peak (hereinafter referred to as fluorescence FWHM). When quantum dots are used as a wavelength conversion material for a visible light region, the reproducibility of a wider range of colors, that is, a wider color gamut can be given as the most major feature. In terms of improving the color gamut, it is important to make the fluorescence FWHM narrow.

When photoluminescence (PL) is used for light emission of a display using quantum dots, a method of converting excitation light from a backlight using blue LEDs to green light, red light with the use of quantum dots is used. On the other hand, for example when electroluminescence (EL) is used for the emission, or for example when light emission of all three primary colors using quantum dots is achieved by other methods, quantum dots with blue emission are required. In that case, in terms of achieving a wide color gamut, the FWHM of not only green and red but also that of blue light is required to be narrow. Thus, when achieving light emission of all three colors of RGB using quantum dots, the fluorescence FWHM of quantum dots with blue emission is required to be narrow.

Typical blue quantum dots include cadmium selenide (CdSe)-based quantum dots using cadmium (Cd); however, use of cadmium is internationally restricted, and there have been significant obstacles to put into practice materials using cadmium selenide-based quantum dots.

On the other hand, chalcopyrite-based quantum dots such as $CuInS_2$ and $AgInS_2$, and indium phosphide (InP)-based quantum dots, for example, are being developed as Cd-free quantum dots that do not use cadmium (for example, see WO 2007/060889 A: PTL 1). However, such quantum dots currently being developed typically have a wide FWHM, and so are not suitable as blue emission quantum dots.

Meanwhile, as blue emission materials, materials having a relatively wide band gap, such as gallium nitride (GaN) and zinc selenide (ZitSe) are known. ZnSe quantum dots have been developed as quantum dots, and many examples of synthesizing blue emission fluorescent materials using ZnSe have been reported. However, there are few reports of practical ZnSe quantum dots having a wavelength and a FWHM that can serve as a substitute for conventional blue LEDs.

For example, Organic Electronics 15 (2014) 126-131 (NPL 1) describes a method of directly synthesizing ZnSe using an organic zinc compound and diphenylphosphine selenide believed to be relatively highly reactive in detail. ZnSe obtained in the paper is not suitable for practical use since it has a fluorescence wavelength of approximately 430 nm, which is less than 450 nm that is a blue fluorescence wavelength used for practical applications.

Further, Materials Science and Engineering C 64 (2016) 167-172 (NPL 2) reports a method of synthesizing ZnSe in water. Although the reaction proceeds at low temperatures, the FWHM is as slightly wide as 30 nm or more and the fluorescence wavelength is less than 430 nm, Thus, ZitSe obtained in the paper is unsuitable for use as a substitute for conventional blue LEDs to achieve a wide color gamut.

CITATION LIST

Patent Literature

PTL 1: WO 2007/060889 A

Non-Patent Literature

NPL 1: Organic Electronics 15 (2014) 126-131
NPL 2: Materials Science and Engineering C 64 (2016) 167-172

SUMMARY OF INVENTION

Technical Problem

As described above, although blue quantum dots are being researched and developed, no quantum dots having a fluorescence wavelength of 430 nm or more and a fluorescence FWHM of 25 nm or less that can be mass-produced have been obtained.

Methods for synthesizing ZnSe described above by direct synthesis include, for example, a. method of using an organic zinc compound such as diethylzinc ($Et_2Zn$) to increase the reactivity of a raw material for zinc. However, since diethylzinc is highly reactive and is flammable in air, it is difficult to handle and store the raw material; for example, diethylzinc must be handled in an inert gas flow. Accordingly, reactions using diethylzinc also involve risks such as heat generation or combustion, so that it is unsuitable for mass production. Similarly, reactions using, for example, hydrogen selenide ($H_2Se$) to increase the reactivity of a material for selenium are also unsuitable for mass production in terms of toxicity and safety Further, in the case of reaction systems using materials for zinc or selenium that are highly reactive, although ZnSe is generated, particle formation is not controlled and the FWHM of the resulting ZnSe is wide.

Methods of synthesizing ZnSe quantum dots with a narrow FWHM have been reported; however, in the reported methods, no blue ZnSe quantum dots with a narrow fluorescence FWHM has been confirmed to be synthesized by safe methods capable of mass production.

The present invention is made in consideration of the above, and seeks to provide Cd-free blue fluorescent quantum dots with a narrow fluorescence FWHM.

Further, the present invention also seeks to provide a method of producing the quantum dots, by which the quantum dots can be safely mass-produced.

Solution to Problem

A quantum dot of the present invention does not contain cadmium (Cd) and has a fluorescence FWHM of 25 nm or less.

In the present invention, the quantum dot is preferably a nanocrystal containing zinc (Zn) and selenium (Se), or zinc (Zn) and selenium (Se) and sulfur (S).

In the present invention, the quantum dot preferably has a core-shell structure in which the nanocrystal serves as a core and a surface of the core is coated with a shell.

In the present invention, the fluorescence wavelength of the quantum dot is preferably 410 nm or more and 470 nm or less.

In the present invention, the ligands are placed on the surface of the quantum dot.

In the present invention, the ligands are preferably comprised of one or two selected from aliphatic amines, phosphines, and aliphatic carboxylic acids.

A method of producing a quantum dot, according to the present invention preferably includes: synthesizing copper chalcogenide as a precursor from an organic copper compound or an inorganic copper compound and, an organic chalcogen compound; and synthesizing a quantum dot free of cadmium (Cd) using the precursor.

In the present invention, metal exchange between copper (Cu) and. zinc (Zn) in the precursor made of the copper chalcogenide is preferably performed.

In the present invention, the metal exchange reaction is preferably performed at 180° C. or more and 280° C. or less. Further, the copper chalcogenide is preferably synthesized at a reaction temperature of 140° C. or more and 250° C. or less.

In the present invention, the quantum dot is preferably a nanocrystal containing zinc and selenium or zinc and selenium and sulfur.

A wavelength converting member of the present invention contains the above quantum dot or a. quantum dot formed by the above method of producing a quantum dot.

A lighting member of the present invention contains the above quantum dot or a quantum dot formed by the above method of producing a quantum dot.

A back light unit of the present invention includes the above quantum dot or a quantum dot formed by the above method of producing a quantum dot.

A display device of the present invention includes the above quantum dot or a quantum dot formed by the above method of producing a quantum dot.

Advantageous Effects of Invention

According to the present invention, quantum dots that are similar in particle shape and size can be synthesized, which makes it possible to reduce the fluorescence FWHM, leading to the improvement of color gamut.

Further, according to the method of producing quantum dots, of the present invention, Cd-free quantum dots with a narrow fluorescence FWHM can be safely produced by a method capable of mass production.

DESCRIPTION OF EMBODIMENTS

Embodiments of the present invention (hereinafter simply referred to as "embodiments") will now be described in detail. Note that the present invention is not limited to the following embodiments, and various modifications may be made without departing from the spirit of the present invention.

Figure 1A:
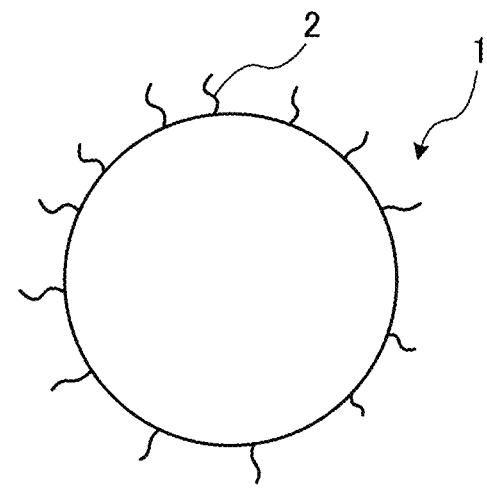
FIG. 1A is a schematic view of a quantum dot according to an embodiment of the present invention.
Figure 1B:
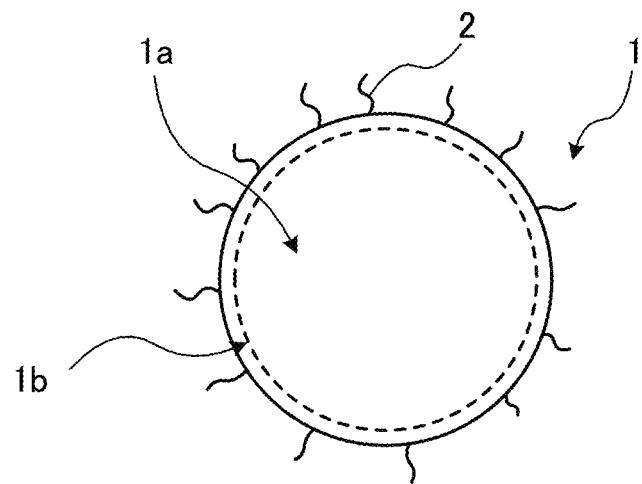
FIG. 1B is a schematic view of a quantum dot according to an embodiment of the present invention.

FIGS. 1A and 1B are schematic views of quantum dots according to this embodiment. A quantum dot 1 shown in FIG. 1A is a nanocrystal which does not contain cadmium (hereinafter referred to as Cd).

In this embodiment, the quantum dot 1 is preferably a nanocrystal containing zinc and selenium (hereinafter referred to as Zn, Se) or zinc and selenium and sulfur (hereinafter referred to as Zn, Se, S).

The quantum dot 1 has fluorescence properties based on near band-edge emission, and the quantum size effect is achieved when the quantum dot is a nanoscale particle.

Here, a "nanocrystal" refers to a nanoparticle having a particle size of around several nanometers to several tens of nanometers. In this embodiment, many quantum dots 1 can be formed to be approximately uniform in particle size.

Zn and Se or Zn and Se and S contained in the quantum dot 1 are main ingredients, and elements other than these elements may be contained. However, it is preferred that Cd is not contained, and phosphorus (P) is also not contained. Since an organic phosphorus compound is expensive and is easily oxidized in air, resulting in unstable synthesis; thus, the cost would be increased, the fluorescence properties will be unstable, and the production process would likely be complicated.

The quantum dot 1 of this embodiment has a fluorescence FWHM of 25 nm or less. "Fluorescence FWHM" herein refers to the full width at half maximum (FWHM) of the spread of the fluorescence wavelength at half the peak value of the fluorescence intensity in the fluorescence spectrum.

Further, the fluorescence FWHM is preferably 23 nm or less. The fluorescence FWHM is more preferably 20 nm or less. The fluorescence FWHM is yet more preferably 17 nm or less. Thus, since the fluorescence FWHM can be made narrow in this embodiment, the color gamut can be improved.

In this embodiment, as described below, for the reaction system for synthesizing the quantum dot 1, copper chalcogenide is synthesized as a precursor, followed by a metal exchange reaction on the precursor. When the quantum dot 1 is produced based on such an indirect synthetic reaction, the fluorescence FWHM can be made narrower; specifically, a fluorescence FWHM of 25 nm or less can be achieved.

Many organic ligands 2 are preferably placed on the surface of the quantum dot 1. This can inhibit aggregation of quantum dots 1, resulting in the target optical properties. The ligands available for the reaction are not particularly limited; for example, the following ligands can be given as typical examples.

Aliphatic primary amines: oleylamine: $C_{18}H_{35}NH_2$, stearyl(octadecyl)amine: $C_{18}H_{37}NH_2$, dodecyl(lauryl) amine: $C_{12}H_{25}NH_2$, decylamine: $C_{10}H_{21}NH_2$, octylamine: $C_8H_{17}NH_2$ Aliphatic acids: oleic acid: $C_{17}H_{33}COOH$, stearic acid: $C_{17}H_{35}COOH$, palmitic acid: $C_{15}H_{31}COOH$, myristic acid: $C_{13}H_{27}COOH$, lauric (dodecanoic) acid: $C_{11}H_{23}COOH$, decanoic acid: $C_9H_{19}COOH$, octanoic acid: $C_7H_{15}COOH$ Thiols: octadecanethiol: $C_{18}H_{37}SH$, hexadecanethiol: $C_{16}H_{33}SH$, tetradecanethiol: $C_{14}H_{29}SH$, dodecanethiol: $C_{12}H_{25}SH$, decanethiol: $C_{10}H_{21}SH$, octanethiol: $C_8H_{17}SH$ Phosphines: trioctylphosphine: $(C_8H_{17})_3P$, triphenylphosphine: $(C_6H_5)_3P$, tributylphosphine: $(C_4H_9)_3P$ Phosphine oxides: trioctylphosphine oxide: $(C_8H_{17})_3P=O$, triphenylphosphine oxide: $(C_6H_5)_3P=O$, tributylphosphine oxide: $(C_4H_9)_3P=O$ The fluorescence quantum yield of the quantum dot 1 in this embodiment is 10% or more. Further, the fluorescence quantum yield is preferably 30% or more, more preferably 50% or more. Thus, in this embodiment, the fluorescence quantum yield of the quantum dot can be increased.

In this embodiment, the fluorescence wavelength can be freely controlled to around 410 nm or more and 470 nm or less. The quantum dot 1 in this embodiment is a ZnSe-based solid solution using a chalcogen in addition to zinc. In this embodiment, the particle size of the quantum dot 1 and the composition of the quantum dot 1 can be adjusted to control the fluorescence wavelength. Accordingly, the fluorescence wavelength is preferably 410 nm or more, more preferably 430 nm or more. Further, the fluorescence wavelength is preferably 440 nm or more, more preferably 470 nm or less, even more preferably 460 nm or less.

Note that, in this embodiment, the fluorescence wavelength can be controlled to blue.

The quantum dot 1 depicted in FIG. 1B has a core-shell structure having a core 1a and a shell 1b covering the surface of the core 1a. As shown in FIG. 1B, many organic ligands 2 are preferably placed on the surface of the quantum dot 1. Further, the fluorescence FWHM of the quantum dot 1 shown in FIG. 1B is 25 nm or less.

The core 1a of the quantum dot 1 shown in FIG. 1B is the nanocrystal shown in FIG. 1A. Accordingly, the core 1a is preferably formed of ZnSe or ZnSeS. As with the core 1a, the shell 1b does not contain cadmium (Cd) either. The material for forming the shell 1b may be, but not limited to, for example, zinc sulfide (ZnS) or the like.

The shell 1b may be in a condition of being a solid solution on the surface of the core 1a. In FIG. 1B, the boundary between the core 1a and the shell 1b is indicated by a dotted line, and this means that the boundary between the core 1a and the shell 1b may or may not be identified by an analysis. In this embodiment, fluorescence is caused also by a ZnSe core alone.

As with FIG. 1A, the fluorescence wavelength of the quantum dot 1 shown in FIG. 1B can also be freely controlled to around 410 nm or more and 470 nm or less. Further, in this embodiment, the fluorescence wavelength can be adjusted to blue.

Subsequently, a method of producing the quantum dot 1 of this embodiment will be described.

First, in this embodiment, copper chalcogenide (precursor) is synthesized from an organic copper compound or an inorganic copper compound and an organic chalcogen compound. Specifically, the precursor is preferably copper selenide: $Cu_2Se$ or copper selenide sulfide: $Cu_2SeS$.

Here, in this embodiment, a raw material for Cu used for $Cu_2Se$ may be, but not limited to, for example, one of the following organic copper reagents and inorganic copper reagents. Specifically, for example, copper(I) acetate: Cu(OAc) or copper(II) acetate: $Cu(OAc)_2$ can be used as an acetate; copper stearate: $Cu(OC(=O)C_{17}H_{35})_2$, copper oleate: $Cu(OC(=O)C_{17}H_{33})_2$, copper myristate: $Cu(OC(=O)C_{13}H_{27})_2$, copper didodecanoate: $Cu(OC(=O)C_{11}H_{23})_2$, or copper acetylacetonate: $Cu(acac)_2$ can be used an aliphatic acid salt; and either a monovalent compound or a divalent compound, for example, copper(I) chloride: CuCl, copper(II) chloride:$CuCl_2$, copper(I) bromide: CuBr, copper (II) bromide: $CuBr_2$, copper(I) iodide: CuI, or copper(II) iodide: $CuI_2$ can be used as a halide.

In this embodiment, for selenium, an organic selenium compound (organic chalcogenide) is used as a raw material. The structure of the compound is not particularly limited, and for example, trioctylphosphine selenide: $(C_8H_{17})_3P=Se$ in which selenium is dissolved in trioctylphosphine, tributylphosphine selenide: $(C_4H_9)_3P=Se$ in which selenium is dissolved in tributylphosphine, or the like can be used. Alternatively, a solution in which selenium is dissolved in a high-boiling solvent that is a long-chain hydrocarbon such as octadecene (Se-ODE) at a high temperature, a solution in which selenium is dissolved in a mixture of oleylamine and dodecanethiol (Se-DDT/OLAm), etc. can be used.

In this embodiment, an organic copper compound or an inorganic copper compound is mixed with an organic chalcogen compound to be dissolved. For a solvent, octadecene can be used as high-boiling saturated hydrocarbon or unsaturated saturated hydrocarbon. Other than the above, t-butylbenzene can be used as a high-boiling aromatic solvent, and butyl butyrate: $C_4H_9COOC_4H_9$, benzyl butyrate: $C_6H_5CH_2COOC_4H_9$, etc. can be used as a high-boiling ester solvent; alternatively, an aliphatic amine compound, an aliphatic acid compound, or an aliphatic phosphorus compound, or a mixture of them may be used as a solvent.

Here, copper chalcogenide (precursor) is synthesized with the reaction temperature being set to 140° C. or more and 250° C. or less. The reaction temperature is preferably as lower as 140° C. or more and 220° C. or less, more preferably even as lower as 140° C. or more and 200° C. or less.

Further, in this embodiment, the reaction process is not particularly limited; however, in order to obtain quantum dots with a narrow FWHM, it is important to synthesize $Cu_2Se$ or $Cu_2SeS$ of similar particle sizes.

Further, in this embodiment, in order to obtain ZnSe of a narrower FWHM as a core, it is important to mix sulfur (S)

as a solid solution in the core. Therefore, it is preferred to add thiol in synthesizing $Cu_2Se$ that is a precursor, and in order to obtain quantum dots with a narrower FWHM, Se-DDT/OLAm is more preferably used as a raw material for Se. Thiols include, but not limited to, for example, octadecanethiol: $C_{18}H_{37}SH$, hexadecanethiol: $C_{16}H_{33}SH$, tetradecanethiol: $C_{14}H_{29}SH$, dodecanethiol: $C_{12}H_{25}SH$, decanethiol: $C_{10}H_{21}SH$, and octanethiol: $C_8H_{17}SH$.

Next, as a raw material for ZnSe or ZnSeS, an organic zinc compound or an inorganic zinc compound is prepared. Organic zinc compounds and inorganic zinc compounds are materials that are stable and easy to handle even in air. The structure of the organic zinc compound or inorganic zinc compound is not limited; however, a highly ionic zinc compound is preferably used to efficiently perform a metal exchange reaction. For example, the following organic zinc compounds and inorganic zinc compounds can be used. Specifically, for example, zinc acetate: $Zn(OAc)_2$ or nitric acid zinc: $Zn(NO_3)_2$ can be used as an acetate; zinc stearate: $Zn(OC(=O)C_{17}H_{35})_2$, zinc oleate: $Zn(OC(=O)C_{17}H_{33})_2$, zinc palmitate: $Zn(OC(=O)C_{15}H_{31})_2$, zinc myristate: $Zn(OC(=O)C_{13}H_{27})_2$, zinc dodecanoate: $Zn(OC(=O)C_{11}H_{23})_2$, or zinc acetylacetonate: $Zn(acac)_2$ can be used as an aliphatic acid salt; zinc chloride: $ZnCl_2$, zinc bromide: $ZnBr_2$, or zinc iodide: $ZnI_2$ can be used as a halide; and zinc diethyl dithiocarbamate: $Zn(SC(=S)N(C_2H_5)_2)_2$ zinc, dimethyldithiocarbamate: $Zn(SC(=S)N(CH_3)_2)_2$, or zinc dibutyldithiocarbamate: $Zn(SC(=S)N(C_4H_9)_2)_2$ can be used as a zinc carbamate.

Subsequently, the above organic zinc compound or inorganic zinc compound is added to a reaction solution in which the precursor of copper chalcogenide is synthesized. This results in a metal exchange reaction between copper (Cu) in copper chalcogenide and zinc (Zn). The metal exchange reaction is preferably made to occur at 180° C. or more and 280° C. or less. The metal exchange reaction is more preferably made to occur at a lower temperature of 180° C. or more and 250° C. or less.

In this embodiment, it is preferred that the metal exchange between Cu and Zn proceeds quantitatively and Cu that is a precursor is not contained in nanocrystals. If Cu that is a precursor remains, Cu acts as a dopant, and light emission is caused by a different mechanism and the FWHM is wider. The amount of Cu left is preferably100 ppm or less, more preferably 50 ppm or less, and ideally 10 ppm or less.

Further, in this embodiment, when the metal exchange is performed, a compound that serves to help isolate the metal of the precursor in the reaction solution by coordination, chelation, etc. is required.

Compounds playing the above role include ligands which can be complexed with Cu. For example, phosphorus-based ligands, amine-based ligands, sulfur-based ligands are preferred; in particular, phosphorus-based ligands are preferred more because of its high efficiency.

Thus, metal exchange of Cu and Zn can be appropriately performed, and quantum dots having a narrow fluorescence FWHM based on Zn and Se can be produced.

In this embodiment, copper chalcogenide is synthesized as the precursor from an organic copper compound or an inorganic copper compound and an organic chalcogen compound, and metal exchange is performed using the precursor to synthesize quantum dots. Thus, in this embodiment, first, quantum dots are synthesized after the synthesis of the precursor; namely, direct synthesis is not performed. Such indirect synthesis renders it unnecessary to use regents that are excessively reactive and so dangerous to handle, and ZnSe-based quantum dots having a narrow FWHM can be safely and stably synthesized.

Further, in this embodiment, desired quantum dots can be obtained by subjecting Cu-Zn to metal exchange by one-pot synthesis without isolating and purifying the precursor. Alternatively, the precursor copper chalcogenide may be used after being isolated and purified.

Further, in this embodiment, even if processes such as cleaning, isolation/purification, coating, and ligand exchange are not performed, the synthesized quantum dots exhibit fluorescent properties.

However, as shown in FIG. 1B, the core 1a made of a nanocrystal such as of ZnSe or ZnSeS is coated by the shell 1b, thereby further increasing the fluorescence quantum yield.

Further, in this embodiment, the core/shell structure can be synthesized in the stage of the precursor. For example, when zinc sulfide (ZnS) is used for the shell structure, copper chalcogenide of the precursor is $Cu_2Se/Cu_2S$. This is synthesized by continuously adding the raw material for S in one reaction vessel, followed by metal exchange of Cu-Zn, thereby obtaining ZnSe/ZnS.

Further, in this embodiment, typical raw materials for S used in the shell structure include, but not limited to, the following materials.

Thiols: octadecanethiol: $C_{18}H_{37}SH$, hexadecanethiol: $C_{16}H_{33}SH$, tetradecanethiol: $C_{14}H_{29}SH$, dodecanethiol: $C_{12}H_{25}SH$, decanethiol: $C_{10}H_{21}SH$, octanethiol: $C_8H_{17}SH$, benzenethiol: $C_6H_5SH$, or a solution in which sulfur is dissolved in a high-boiling solvent that is a long-chain hydrocarbon such as octadecene(S—ODE) or a solution in which selenium is dissolved in a mixture of oleylamine and dodecanethiol (S-DDT/OLAm); etc. can be used.

The uses of the quantum dot 1 shown in FIG. 1A and FIG. 1B are not particularly limited; for example, the quantum dot 1 exhibiting blue fluorescence in this embodiment can be applied to a wavelength converting member, a lighting member, a back light unit, a display device, etc.

When the quantum dot 1 in this embodiment is applied to part of a wavelength converting member, a lighting member, a back light unit, and a display device and for example, photoluminescence (PL) is used for light emission; blue fluorescence can be induced by UV radiation from a light source. Alternatively, when electroluminescence (EL) is used for the emission, or for example when light emission of all three primary colors is achieved by other methods, a light-emitting device giving blue fluorescence using the quantum dot 1 of this embodiment can be obtained. In this embodiment, a light-emitting device (full color LED) including the quantum dots 1 exhibiting blue fluorescence in this embodiment in addition to quantum dots exhibiting green fluorescence and quantum dots exhibiting red fluorescence is obtained, thus white color emission can be achieved.

A wavelength converting member is formed as a sheet or a film, or formed from a molding. For example, a molding of resin in which quantum dots are dispersed is fitted in a container having a receiving space by press fitting etc. Here, the refractive index of the molding is preferably smaller than the refractive index of the container. Thus, part of light incident on the molding is totally reflected by an inner wall of the container. This can reduce light beams leaking out from the sides of the container. When the quantum dot having a narrow fluorescence FWHM in this embodiment is applied to a wavelength converting member, a lighting member, a back light unit, a display device, etc., the light emission properties of the device can be effectively improved.

EXAMPLES

The effects of the present invention will be described using Examples and Comparative Examples. Note that the present invention is not limited to the following examples in any way.

<Raw Materials>

In the present invention, the following raw materials were used to synthesize quantum dots free of cadmium.

Solvent

Octadecene: product of Sigma-Aldrich Co. LLC/Idemitsu Kosan Co.,Ltd
Oleylamine: FARMIN produced by Kao Corporation
Oleic acid: LUNAC O—V produced by Kao Corporation
Trioctylphosphine: product of HOKKO CHEMICAL INDUSTRY CO., LTD.
Zinc chloride: product of Sigma-Aldrich Co. LLC/ KISHIDA CHEMICAL Co.,Ltd.
Zinc iodide: product of Sigma-Aldrich Co. LLC
Zinc acetate dihydrate: product of IKOMA chemical products Co. Ltd.
Anhydrous zinc acetate: product of Sigma-Aldrich Co. LLC
Selenium (4N: 99.99%): product of Shinko Chemical Co., Ltd./Sigma-Aldrich Co. LLC
Sulfur: product of KISHIDA CHEMICAL Co., Ltd.

<Measurement System>

Spectrofluorometer: F-2700 produced by Hitachi-Tech Science Corporation
Ultraviolet-visible spectrophotometer: V-770 produced by JASCO Corporation
Quantum yield measurement system: QE-1100 produced by Otsuka Electronics Co., Ltd.
X-ray diffraction (XRD) system: D2 PHASER produced by Bruker Corporation
Scanning electron microscope (SEM): SU9000 produced by Hitachi High-Tech Science Corporation

EXAMPLE 1

Into a 100 mL reaction vessel, 131 mg of copper acetylacetonate: $Cu(acac)_2$, 1.5 mL of dodecanethiol: DDT, 4.75 mL of oleylamine: OLAm, and 6.25 mL of octadecene: ODE were charged. Heating was then performed while stirring in an inert gas ($N_2$) atmosphere, thereby dissolving the raw materials.

To this solution, 1.75 mL of a Se-DDT/OLAm solution (0.3M) was added, and heating was performed while stirring at 220° C. for 10 minutes. The resultant reaction solution ($C_2Se(S)$) was cooled to room temperature.

Ethanol was added to the $Cu_2Se$ reaction solution to cause precipitation, and centrifugal separation was performed to recover the precipitate. ODE was added to disperse the precipitate.

To the $Cu_2Se(S)$—ODE solution, 682 mg of zinc chloride: $ZnCl_2$, 10 mL of trioctylphosphine: TOP, and 0.4 mL of oleylamine: OLAm were added, and heating was performed while stirring in an inert gas ($N_2$) atmosphere at 220° C. for 30 minutes. The resultant reaction solution (ZnSe) was cooled to room temperature.

Ethanol was added to the ZnSe(S) reaction solution to cause precipitation, and centrifugal separation was performed to recover the precipitate. ODE was added to disperse the precipitate.

To 14 mL of the ZnSe(S)—ODE solution, 682 mg of zinc chloride: $ZnCl_2$, 5 mL of trioctylphosphine: TOP, and 0.5 mL of oleylamine: OLAm were added, and heating was performed while stirring in an inert gas ($N_2$) atmosphere at 280° C. for 120 minutes. The resultant reaction solution (ZnSe(S)) was cooled to room temperature.

Figure 2:
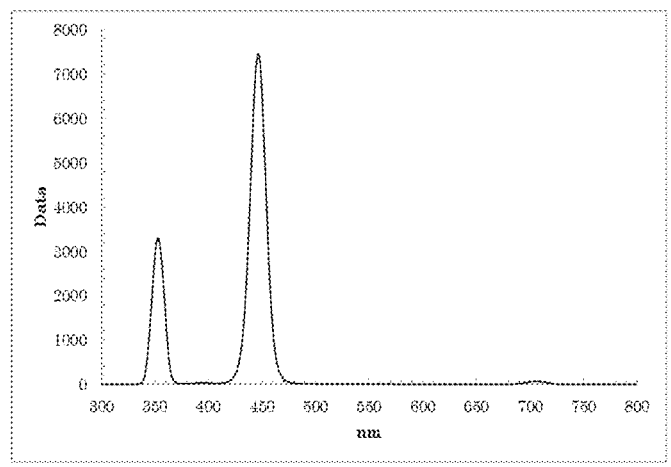
FIG. 2. shows a fluorescence (photoluminescence: PL) spectrum exhibited by ZnSe in Example 1.

The resultant reaction solution was subjected to a measurement using the spectrofluorometer. Thus, as shown in FIG. 2, a fluorescence wavelength of approximately 446.0 nm and a fluorescence FWHM of approximately 16.6 nm were obtained as optical properties.

The resultant reaction solution was subjected to a measurement using the quantum efficiency measurement system. As a result, the quantum yield was approximaely 30.6%.

Further, ethanol was added to the resultant reaction solution to cause precipitation, and centrifugal separation was performed to recover the precipitate. Toluene was then added to disperse the precipitate, thereby obtaining a dispersion solution in which ZnSe(S) particles were dispersed.

EXAMPLE 2

Into a 100 ml, reaction vessel. 36.3 mg of anhydrous copper acetate: $Cu(OAc)_2$, 0.3 mL of dodecanethiol: DDT, 0.4 mL of a Se-DDT/OLAm solution (0.5M), and 10 mL of octadecene: ODE were charged. Heating was then performed while stirring in an inert gas ($N_2$) atmosphere at 220° C. for 10 minutes. The resultant reaction solution ($Cu_2Se(S)$) was cooled to room temperature.

After that, 273 mg of zinc chloride: $ZnCl_2$, 3 mL of trioctylphosphine: TOP, and 0.1 mL of oleylamine: OLAm were added to the solution, and heating was performed while stirring in an inert gas ($N_2$) atmosphere at 230° C. for 30 minutes. The resultant reaction solution (ZnSe(S)) was cooled to room temperature.

Figure 3:
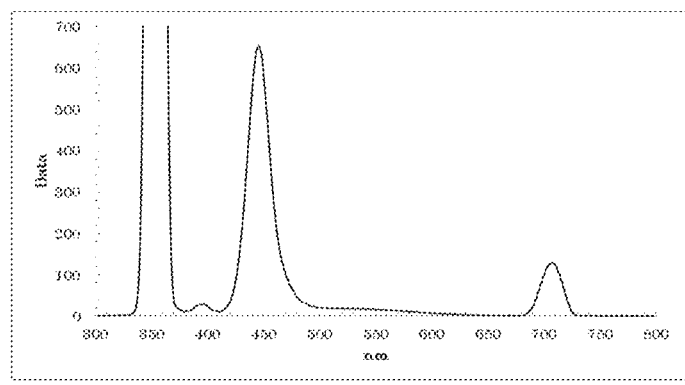
FIG. 3 shows a PL spectrum exhibited by ZnSe in Example 2.

The resultant reaction solution was subjected to a measurement using the spectrofluorometer. Thus, as shown in FIG. 3, a fluorescence wavelength of approximately 445.5 nm and a fluorescence FWHM of approximately 23.0 nm were obtained as optical properties.

EXAMPLE 3

Into a 100 mL reaction vessel, 131 mg of copper acetylacetonate: $Cu(acac)_2$, 1.5 mL of dodecanethiol: DDT, 4.75 mL of oleylamine: OLAm, and 6.25 mL of octadecene: ODE were charged. Heating was then performed while stirring in an inert gas ($N_2$) atmosphere, thereby dissolving the raw materials.

To this solution, 1 mL of a Se-DDT/OLAm solution (0.5M) was added, and heating was performed while stirring at 200° C. for 10 minutes.

To this solution, 1 mL of a S-DDT/OLAm solution (0.2M) was added, and heating was performed while stirring at 200° C. for 10 minutes. The resultant reaction solution ($Cu_2SeS$) was cooled to room temperature.

Ethanol was added to the $Cu_2SeS$ reaction solution to cause precipitation, and centrifugal separation was performed to recover the precipitate. TOP was added to disperse the precipitate.

After that, 682 mg of zinc chloride: $ZnCl_2$ and 0.4 mL of oleylamine: OLAm were added to the $Cu_2SeS$—ODE solution, and heating was performed while stirring in an inert gas ($N_2$) atmosphere at 230° C. for 60 minutes. The resultant reaction solution (ZnSeS) was cooled to room temperature.

Figure 4:
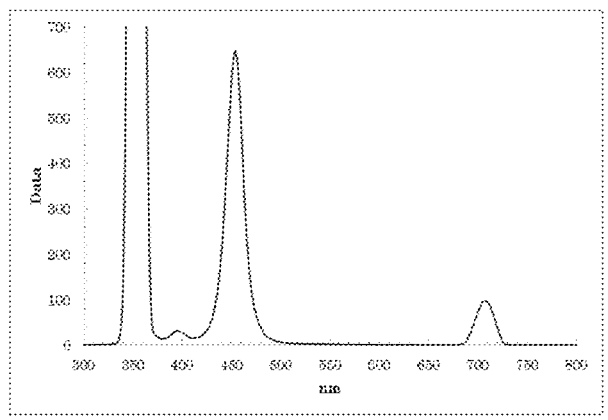
FIG. 4 shows a PL spectrum exhibited by ZnSe in Example 3.

The resultant reaction solution was subjected to a measurement using the spectrofluorometer. Thus, as shown in FIG. 4, a fluorescence wavelength of approximately 454.0 nm and a fluorescence FWHM of approximately 19.7 nm were obtained as optical properties.

EXAMPLE 4

Into a 100 mL reaction vessel, 1.2 mL of a. solution of copper oleate in octadecene (0.2M): Cu(OLAc)$_2$-ODE, 3 mL of a Se-ODE solution, 0.4 mL of dodecanethiol: DDT, and 3 mL of octadecene: ODE were charged. This solution was heated while stirring at 200° C. for 60 minutes. The resultant reaction solution (Cu$_2$SeS) was cooled to room temperature.

To this Cu$_2$SeS reaction solution, 5 mL of trioctylphosphine: TOP, 1.0 mL of oleylamine: OLAm, and 940 mg of zinc chloride: ZnCl$_2$ were added, and heating was performed while stirring in an inert gas (N$_2$) atmosphere at 200° C. for 20 minutes. The resultant reaction solution (ZnSeS) was cooled to room temperature.

Figure 5:
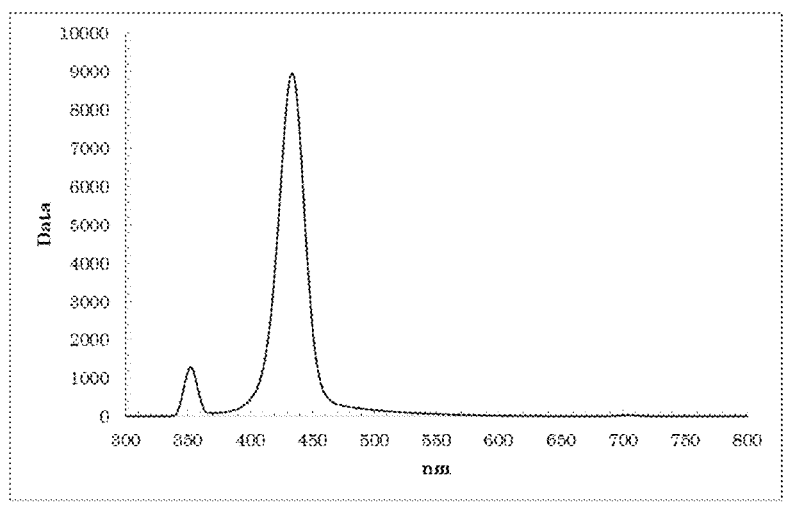
FIG. 5 shows a PL spectrum exhibited by ZnSe in Example 4.

The resultant reaction solution was subjected to a measurement using the spectrofluorometer. Thus, as shown in FIG. 5, a fluorescence wavelength of approximately 434.0 nm and a fluorescence FWHM of approximately 23.5 nm were obtained as optical properties.

EXAMPLE 5

Into a 300 mL reaction vessel, 543 mg of anhydrous copper acetate: Cu(OAc)$_2$, 9 mL of dodecanethiol: DDT, 28.5 mL of oleylamine: OLAm, and 37.5 mL of octadecene: ODE were charged. Heating was then performed while stirring in an inert gas (N$_2$) atmosphere, thereby dissolving the raw materials.

To this solution, 10.5 mL of a Se-DDT/OLAm solution (0.3M) was added, and heating was performed while stirring at 220° C. for 10 minutes. The resultant reaction solution (Cu$_2$Se(S)) was cooled to room temperature.

Ethanol was added to the Cu$_2$Se(S) reaction solution to cause precipitation, and centrifugal separation was performed to recover the precipitate. ODE was added to disperse the precipitate.

To the Cu$_2$Se(S)-ODE solution, 4092 mg of zinc chloride: ZnCl$_2$, 60 mL of trioctylphosphine: TOP, and 2.4 mL of oleylamine: OLAm were added, and heating was performed while stirring in an inert gas (N$_2$) atmosphere at 220° C. for 30 minutes. The resultant reaction solution (ZnSe(S)) was cooled to room temperature.

Ethanol was added to the ZnSe(S) reaction solution to cause precipitation, and centrifugal separation was performed to recover the precipitate. ODE was added to disperse the precipitate.

To the ZnSe(S)-ODE solution, 4092 mg of zinc chloride: ZnCl$_2$, 30 mL of trioctylphosphine: TOP, and 3 mL of oleylamine: OLAm were added, and heating was performed while stirring in an inert gas (N$_2$) atmosphere at 280° C. for 120 minutes. The resultant reaction solution (ZnSe(S)) was cooled to room temperature.

To this solution, 15 mL of a S-DDT/OLAm solution (0.1M) was added, and heating was performed while stirring at 220° C. for 30 minutes. The resultant reaction solution (ZnSe(S)) was cooled to room temperature.

Ethanol was added to the ZnSe(S) reaction solution to cause precipitation, and centrifugal separation was performed to recover the precipitate. ODE was added to disperse the precipitate.

To the ZnSe(S)-ODE solution, 2052 mg of zinc chloride: ZnCl$_2$, 36 mL of trioctylphosphine: TOP, and 1.2 mL of oleylamine: OLAm were added, and heating was performed while stirring in an inert gas (N$_2$) atmosphere at 230° C. for 60 minutes. The resultant reaction solution (ZnSe(S)) was cooled to room temperature.

Figure 6:
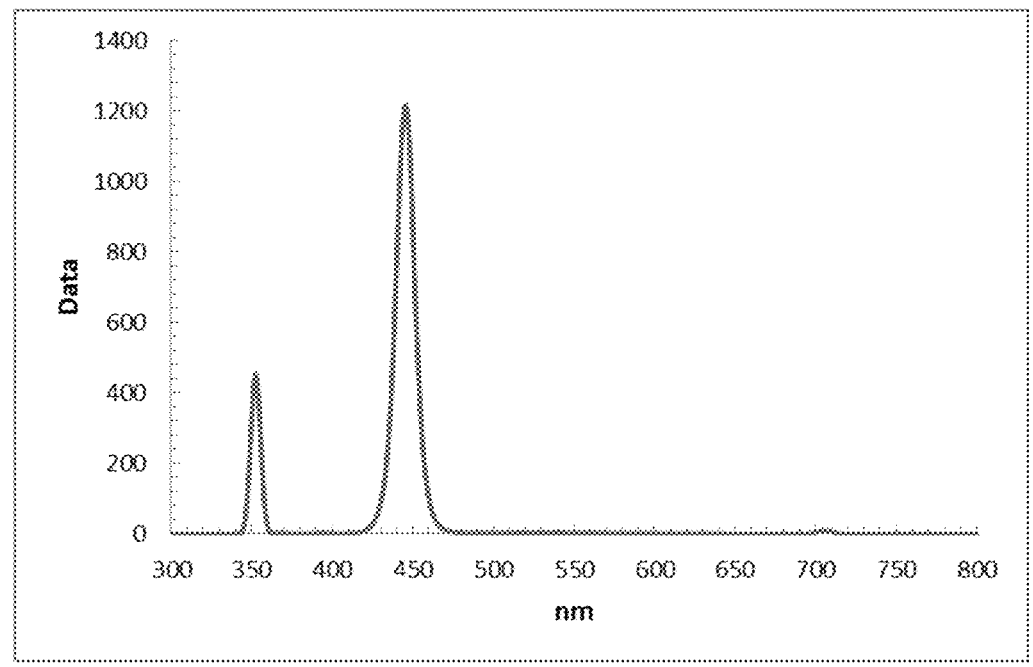
FIG. 6 shows a PL spectrum exhibited by ZnSe in Example 5.

The resultant reaction solution was subjected to a measurement using the spectrofluorometer. Thus, as shown in FIG. 6, a fluorescence wavelength of approximately 445.5 nm and a fluorescence FWHM of approximately 13.3 nm were obtained as optical properties.

The resultant reaction solution was subjected to a measurement using the quantum efficiency measurement system, As a result, the quantum yield was approximately 52%.

EXAMPLE 6

Into a 300 mL reaction vessel, 543 mg of anhydrous copper acetate: Cu(OAc)$_2$, 9 mL of dodecanethiol: DDT, 9 mL of oleylamine: OLAm, and 57 mL of octadecene: ODE were charged. Heating was then performed while stirring in an inert gas (N$_2$) atmosphere, thereby dissolving the raw materials.

To this solution, 10.5 mL of a Se-DDT/OLAm solution (0.3M) was added, and heating was performed while stirring at 220° C. for 10 minutes. The resultant reaction solution (Cu$_2$Se(S)) was cooled to room temperature.

To this solution, 4092 mg of zinc chloride: ZnCl$_2$, 60 mL of trioctylphosphine: TOP, and 2.4 mL of oleylamine: OLAm were added, and heating was performed while stirring in an inert gas (N$_2$) atmosphere at 220° C. for 30 minutes. The resultant reaction solution (ZnSe) was cooled to room temperature.

Ethanol was added to the ZnSe(S) reaction solution to cause precipitation, and centrifugal separation was performed to recover the precipitate. ODE was added to disperse the precipitate.

To the ZnSe(S)-ODE solution, 6150 mg of zinc chloride: ZnCl$_2$, 30 mL of trioctylphosphine: TOP, and 3 mL: of oleylamine: OLAm were added, and heating was performed while stirring in an inert gas (N$_2$) atmosphere at 280° C. for 60 minutes. The resultant reaction solution (ZnSe(S)) was cooled to room temperature.

To this solution, 15 mL of a S-DDT/OLAm solution (0.1M) was added, and heating was performed while stirring at 220° C. for 30 minutes. The resultant reaction solution (ZnSe(S)) was cooled to room temperature.

To this solution, 2052 mg of zinc chloride: ZnCl$_2$, 36 mL of trioctylphosphine: TOP, and 1.2 mL of oleylamine: OLAm were added, and heating was performed while stirring in an inert gas (N$_2$) atmosphere at 230° C. for 60 minutes. The resultant reaction solution (ZnSe(S)) was cooled to room temperature.

Figure 7:
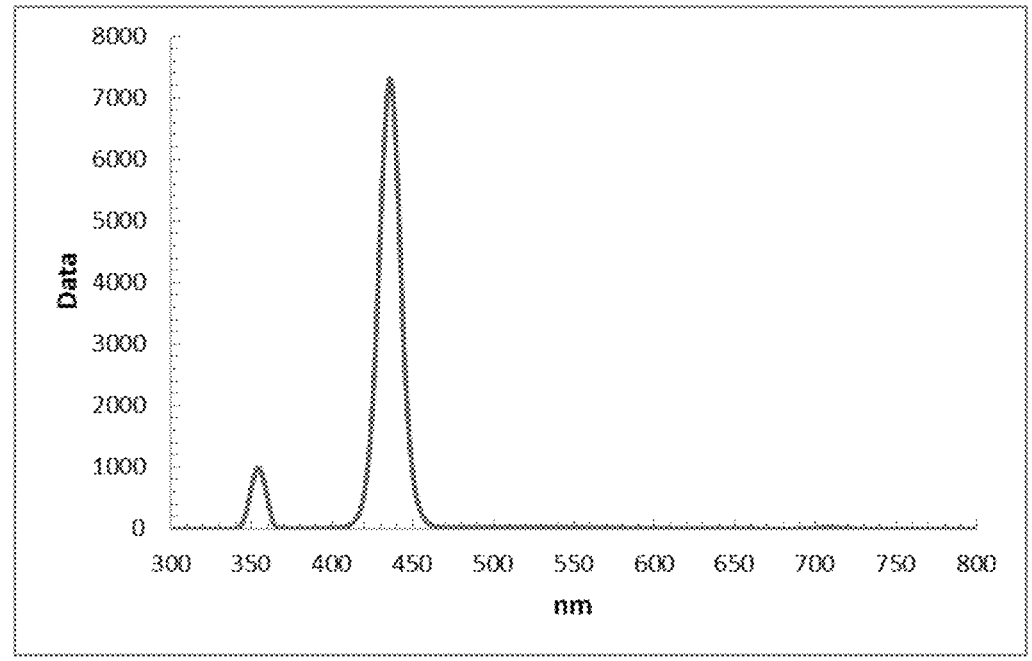
FIG. 7 shows a PL spectrum exhibited by ZnSe in Example 6.

The resultant reaction solution was subjected to a measurement using the spectrofluorometer. Thus, as shown in FIG. 7, a fluorescence wavelength of approximately 436.0 nm and a fluorescence FWHM of approximately 15.2 nm were obtained as optical properties.

The resultant reaction solution was subjected to a measurement using the quantum efficiency measurement system. As a result, the quantum yield was approximately 66%.

EXAMPLE 7

Into a 300 mL reaction vessel, 546 mg of anhydrous copper acetate: Cu(OAc)$_2$, 9 mL of dodecanethiol: DDT, 9 mL of oleylamine: OLAm, and 57 mL of octadecene: ODE were charged. Heating was then performed while stirring in an inert gas ($N_2$) atmosphere, thereby dissolving the raw materials.

To this solution, 8.4 mL of a Se-DDT/OLAm solution (0.3M) was added, and heating was performed while stirring at 220° C. for 10 minutes. The resultant reaction solution ($Cu_2Se(S)$) was cooled to room temperature.

Ethanol was added to the $Cu_2Se$ reaction solution to cause precipitation, and centrifugal separation was performed to recover the precipitate. ODE was added to disperse the precipitate.

To the $Cu_2Se(S)$-ODE solution, 4092 mg of zinc chloride: $ZnCl_2$, 60 mL of trioctylphosphine: TOP, and 2.4 mL of oleylamine: OLAm were added, and heating was performed while stirring in an inert gas ($N_2$) atmosphere at 220° C. for 30 minutes. The resultant reaction solution (ZnSe) was cooled to room temperature.

Ethanol was added to the ZnSe(S) reaction solution to cause precipitation, and centrifugal separation was performed to recover the precipitate. ODE was added to disperse the precipitate.

To the ZnSe(S)-ODE solution, 4092 mg of zinc chloride: $ZnCl_2$, 30 mL of trioctylphosphine: TOP, and 3 mL of oleylamine: OLAm were added, and heating was performed while stirring in an inert gas ($N_2$) atmosphere at 280° C. for 30 minutes. The resultant reaction solution (ZnSe(S)) was cooled to room temperature.

To this solution, 15 mL of a S-DDT/OLAm solution (0.1M) was added, and heating was performed while stirring at 220° C. for 30 minutes. The resultant reaction solution (ZnSe(S)) was cooled to room temperature.

Ethanol was added to the ZnSe(S) reaction solution to cause precipitation, and centrifugal separation was performed to recover the precipitate. ODE was added to disperse the precipitate.

To the ZnSe(S)-ODE solution, 2052 mg of zinc chloride: $ZnCl_2$, 36 mL of trioctylphosphine: TOP, and 1.2 mL of oleylamine: OLAm were added, and heating was performed while stirring in an inert gas ($N_2$) atmosphere at 230° C. for 60 minutes. The resultant reaction solution (ZnSe(S)) was cooled to room temperature.

Figure 8:
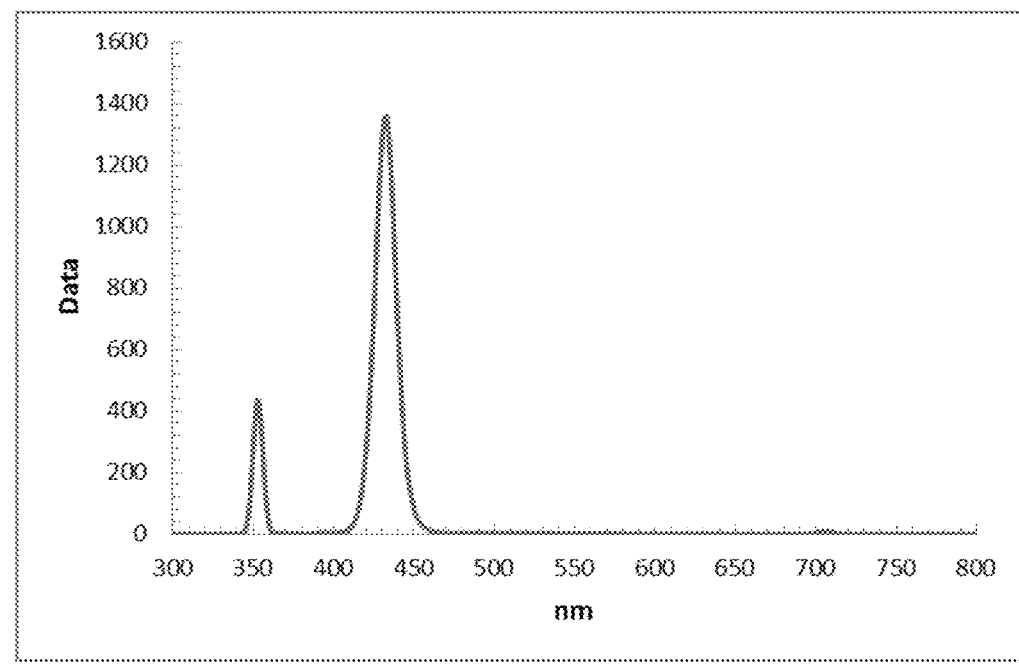
FIG. 8 shows a PL spectrum exhibited by ZnSe in Example 7.

The resultant reaction solution was subjected to a measurement using the spectrofluorometer. Thus, as shown in FIG. 8, a fluorescence wavelength of approximately 432.0 nm and a fluorescence FWHM of approximately 15.3 nm were obtained as optical properties.

The resultant reaction solution was subjected to a measurement using the quantum efficiency measurement system. As a result, the quantum yield was approximately 70%.

EXAMPLE 8

Into a 100 mL reaction vessel, 72.6 mg of anhydrous copper acetate: $Cu(OAc)_2$, 0.263 mL of oleylamine: OLAm, and 10 mL of octadecene: ODE were charged. Heating was then performed while stirring in an inert gas ($N_2$) atmosphere, thereby dissolving the raw materials.

To this solution, 2 mL of a Se-ODE solution (0.1M) was added, and heating was performed while stirring at 145° C. for 30 minutes. The resultant reaction solution ($Cu_2Se$) was cooled to room temperature.

After that, 546 mg of zinc chloride: $ZnCl_2$, 5 mL of trioctylphosphine: TOP, and 0.1 mL of oleylamine: OLAm were added to the solution, and heating was performed while stirring in an inert gas ($N_2$) atmosphere at 220° C. for 30 minutes. The resultant reaction solution (ZnSe) was cooled to room temperature.

Ethanol was added to the ZnSe reaction solution to cause precipitation, and centrifugal separation was performed to recover the precipitate. ODE was added to disperse the precipitate.

After that, 546 mg of zinc chloride: $ZnCl_2$, 5 mL of trioctylphosphine: TOP, and 0.1 mL of oleylamine: OLAm were added to the ZnSe-ODE solution, and heating was performed while stirring in an inert gas ($N_2$) atmosphere at 280° C. for 30 minutes. The resultant reaction solution (ZnSe) was cooled to room temperature.

To this solution, 2 mL of a S-DDT/OLAm solution (0.1M) was added, and heating was performed while stirring at 220° C. for 30 minutes. The resultant reaction solution (ZnSe(S)) was cooled to room temperature.

After that, 274 mg of zinc chloride: $ZnCl_2$, 6 mL of trioctylphosphine: TOP, and 0.2 mL of oleylamine: OLAm were added to the solution, and heating was performed while stirring in an inert gas ($N_2$) atmosphere at 230° C. for 30 minutes. The resultant reaction solution (ZnSe(S)) was cooled to room temperature.

Figure 9:
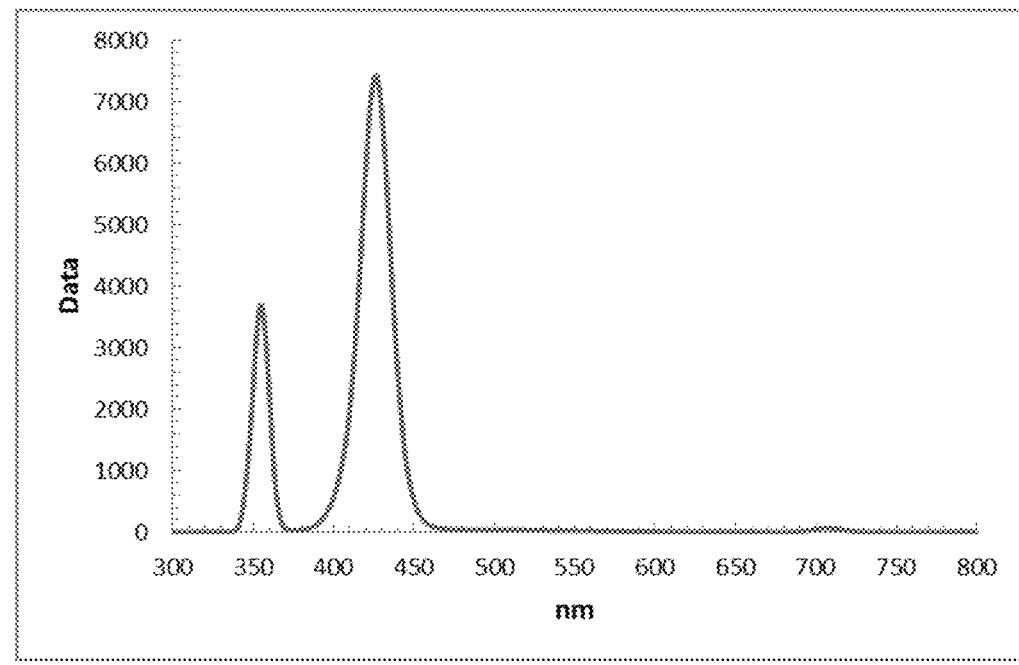
FIG. 9 shows a PL spectrum exhibited by ZnSe in Example 8.

The resultant reaction solution was subjected to a measurement using the spectrofluorometer. Thus, as shown in FIG. 9, a fluorescence wavelength of approximately 425.5 nm and a fluorescence FWHM of approximately 22.1 nm were obtained as optical properties.

The resultant reaction solution was subjected to a measurement using the quantum efficiency measurement system. As a result, the quantum yield was approximately 63%.

EXAMPLE 9

Into a 100 mL reaction vessel, 182 mg of anhydrous copper acetate: $Cu(OAc)_2$, 3 mL of dodecanethiol: DDT, 9.5 mL of oleylamine: OLAm, and 12.5 mL of octadecene: ODE were charged. Heating was then performed while stirring in an inert gas ($N_2$) atmosphere, thereby dissolving the raw materials.

To this solution, 2 mL of a Se-DDT/OLAm solution (0.5M) was added, and heating was performed while stirring at 220° C. for 10 minutes, followed by the addition of 8 mL of a Se-ODE solution (0.1M), and heating was then performed while stirring at 220° C. for 10 minutes. The resultant reaction solution ($Cu_2Se(S)$) was cooled to room temperature.

To this solution. 1364 mg of zinc chloride: $ZnCl_2$, 20 mL of trioctylphosphine: TOP, and 0.8 mL of oleylamine: OLAm were added, and heating was performed while stirring in an inert gas ($N_2$) atmosphere at 220° C. for 30 minutes. The resultant reaction solution (ZnSe(S)) was cooled to room temperature.

Ethanol was added to the ZnSe(S) reaction solution to cause precipitation, and centrifugal separation was performed to recover the precipitate. ODE was added to disperse the precipitate.

To the ZnSe(S)-ODE solution, 2050 mg of zinc chloride: $ZnCl_2$, 10 mL of trioctylphosphine: TOP, and 1 mL of oleylamine: OLAm were added, and heating was performed while stirring in an inert gas ($N_2$) atmosphere at 280° C. for 120 minutes. The resultant reaction solution (ZnSe(S)) was cooled to room temperature.

Figure 10:
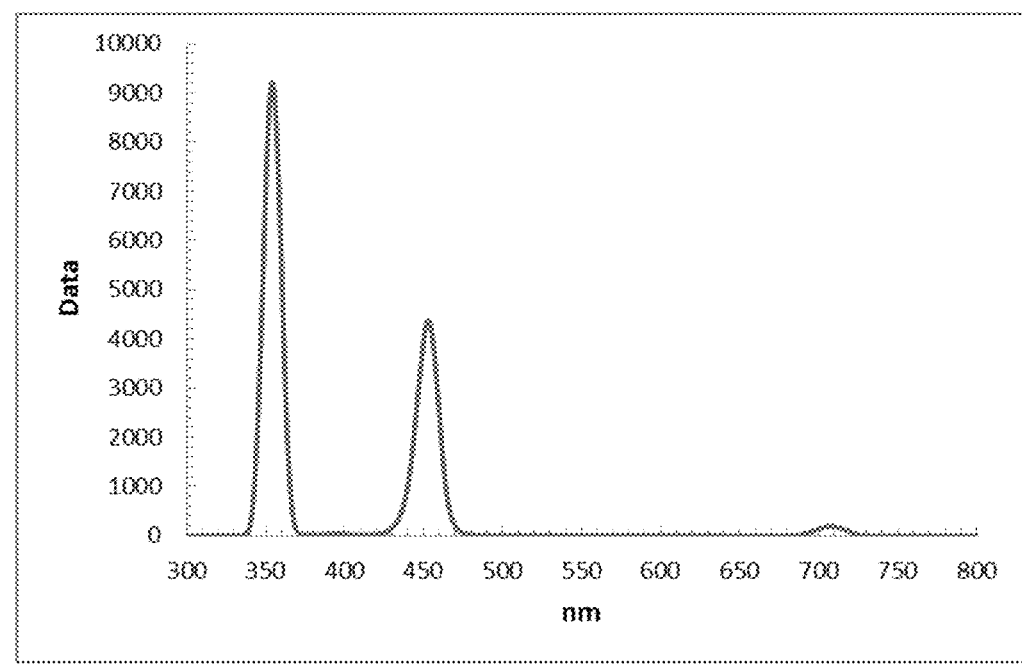
FIG. 10 shows a PL spectrum exhibited by ZnSe in Example 9.

The resultant reaction solution was subjected to a measurement using the spectrofluorometer. Thus, as shown in FIG. 10, a fluorescence wavelength of approximately 452.5 nm and a fluorescence FWHM of approximately 16.2 nm were obtained as optical properties.

The resultant reaction solution was subjected to a measurement using the quantum efficiency measurement system. As a result, the quantum yield was approximately 25%.

EXAMPLE 10

To the reaction solution of Example 6, 0.6 mL of dodecylamine: DDA was added, and heating was performed while stirring in an inert gas ($N_2$) atmosphere at 220° C. for 5 minutes.

To this solution, 6 mL of a S—ODE solution (0.1M) was added, and heating was performed while stirring at 220° C. for 10 minutes, followed by the addition of 12 mL of a zinc octanoate solution (0.1M), and heating was then performed while stirring at 220° C. for 10 minutes. A process of heating and stirring the S—ODE solution and the zinc octanoate solution was performed twice in total. This solution was then heated while stirring at 200° C. for 30. The resultant reaction solution (ZnSe(S)-ZnS) was cooled to room temperature.

The resultant reaction solution was subjected to a measurement using the spectrofluorometer. Thus, a fluorescence wavelength of approximately 436.0 nm and a fluorescence FWHM of approximately 14.7 nm were obtained as optical properties.

The resultant reaction solution was subjected to a measurement using the quantum efficiency measurement system. As a result, the quantum yield was approximately 58%.

EXAMPLE 11

To 100 mL of the reaction solution of Example 6, 1 mL of dodecylamine: DDA was added, and heating was performed while stirring in an inert gas ($N_2$) atmosphere at 220° C. for 5 minutes.

To this solution, 10 mL of a S-DDT/OLAm solution (0.1M) was added, and heating was performed while stirring at 220° C. for 10 minutes, followed by the addition of 20 mL of a zinc octanoate solution (0.1M), and heating was then performed while stirring at 220° C. for 10 minutes. A process of heating and stirring the S—ODE solution and the zinc octanoate solution was performed twice in total. This solution was then heated while stirring at 200° C. for 30. The resultant reaction solution (ZnSe(S)-ZnS) was then cooled to room temperature.

The resultant reaction solution was subjected to a measurement using the spectrofluorometer. Thus, a fluorescence wavelength of approximately 436.0 nm and a fluorescence FWHM of approximately 15.1 nm were obtained as optical properties.

The resultant reaction solution was subjected to a measurement using the quantum efficiency measurement system. As a result, the quantum yield was approximately 48%.

EXAMPLE 12-1

Ethanol was added to 10 mL of the reaction solution of Example 5 to 2.0 cause precipitation, and centrifugal separation was performed to recover the precipitate. ODE was added to disperse the precipitate.

To this reaction solution, 0.75 mL of oleylamine: OLAm was added, and heating was performed while stirring in an inert gas ($N_2$) atmosphere at 320° C. for 3 minutes.

After that, 0.25 mL of a mixed solution of 5 mL of a zinc oleate solution (0.4M) and 0.375 mL of dodecanethiol: DDT was added, and heating was performed while stirring at 220° C. for 10 minutes. This mixed solution was further added, and a process of heating and stirring was performed three times in total. The resultant reaction solution (ZnSe(S)-ZnS) was then cooled to room temperature.

Further, ethanol was added to the resultant reaction solution to cause precipitation, and centrifugal separation was performed to recover the precipitate. Hexane was then added to disperse the precipitate, thereby obtaining a dispersion solution in which ZnSe(S)-ZnS particles were dispersed.

The resultant hexane dispersion solution was subjected to a measurement using the spectrofluorometer. Thus, a fluorescence wavelength of approximately 445.5 nm and a fluorescence FWHM of approximately 22.5 nm were obtained as optical properties.

The resultant reaction solution was subjected to a measurement using the quantum efficiency measurement system. As a result, the quantum yield was approximately 3%.

EXAMPLE 12-2

Ethanol was added to 12.5 mL of the reaction solution of Example 6 to cause precipitation, and centrifugal separation was performed to recover the precipitate. ODE was added to disperse the precipitate.

To this reaction solution, 0.75 mL of oleylamine: OLAm was added, and heating was performed while stirring in an inert gas ($N_2$) atmosphere at 320° C. for 3 minutes.

After that, 0.25 mL of a mixed solution of 5 mL of a zinc oleate solution (0.4M) and 0.375 mL of dodecanethiol: DDT was added, and heating was performed while stirring at 220° C. for 10 minutes. This mixed solution was further added, and a process of heating and stirring was performed three times in total. The resultant reaction solution (ZnSe(S)-ZnS) was then cooled to room temperature.

Further, ethanol was added to the resultant reaction solution to cause precipitation, and centrifugal separation was performed to recover the precipitate. Hexane was then added to disperse the precipitate, thereby obtaining a dispersion solution in which ZnSe(S)-ZnS particles were dispersed.

The resultant hexane dispersion solution was subjected to a measurement using the spectrofluorometer. Thus, a fluorescence wavelength of approximately 431.0 nm and a fluorescence FWHM of approximately 18.0 nm were obtained as optical properties.

The resultant reaction solution was subjected to a measurement using the quantum efficiency measurement system. As a result, the quantum yield was approximately 9%.

EXAMPLE 12-3

Ethanol was added to 10 mL of the reaction solution of Example 7 to cause precipitation, and centrifugal separation was performed to recover the precipitate. ODE was added to disperse the precipitate.

To this reaction solution, 0.75 mL of oleylamine: OLAm was added, and heating was performed while stirring in an inert gas ($N_2$) atmosphere at 320° C. for 3 minutes.

After that, 0.25 mL of a mixed solution of 5 mL of a zinc oleate solution (0.4M) and 0.375 mL of dodecanethiol: DDT was added, and heating was performed while stirring at 220° C. for 10 minutes. This mixed solution was further added, and a process of heating and stirring was performed three times in total. The resultant reaction solution (ZnSe(S)-ZnS) was then cooled to room temperature.

Further, ethanol was added to the resultant reaction solution to cause precipitation, and centrifugal separation was performed to recover the precipitate. Hexane was then added to disperse the precipitate, thereby obtaining a dispersion solution in which ZnSe(S)-ZnS particles were dispersed.

The resultant hexane dispersion solution was subjected to a measurement using the spectrofluorometer. Thus, a fluorescence wavelength of approximately 432.0 nm and a fluorescence FWHM of approximately 21.0 nm were obtained as optical properties.

The resultant reaction solution was subjected to a measurement using the quantum efficiency measurement system. As a result, the quantum yield was approximately 23%.

EXAMPLE 13

Ethanol was added to 10 mL of the reaction solution of Example 7 to cause precipitation, and centrifugal separation was performed to recover the precipitate. ODE was added to disperse the precipitate.

This solution was heated while being stirred in an inert gas ($N_2$) atmosphere at 280° C. for 3 minutes.

After that, 0.25 mL of a mixed solution of 5 mL of a zinc oleate solution (0.4M) and 0.375 mL of dodecanethiol: DDT was added, and heating was performed while stirring at 220° C. for 10 minutes. This mixed solution was further added, and a process of heating and stirring was performed 12 times in total. The resultant reaction solution (ZnSe(S)-ZnS) was then cooled to room temperature.

Further, ethanol was added to the resultant reaction solution to cause precipitation, and centrifugal separation was performed to recover the precipitate. Hexane was then added to disperse the precipitate, thereby obtaining a dispersion solution in which ZnSe(S)-ZnS particles were dispersed.

The resultant hexane dispersion solution was subjected to a measurement using the spectrofluorometer. Thus, a fluorescence wavelength of approximately 430.0 nm and a fluorescence FWHM of approximately 16.0 nm were obtained as optical properties.

The resultant reaction solution was subjected to a measurement using the quantum efficiency measurement system. As a result, the quantum yield was approximately 54%.

Comparative Example 1

Into a 100 mL reaction vessel, 0.833 ml of zinc oleate: Zn(OLAc)$_2$-ODE solution (0.4M) and 10 mL of a Se-ODE solution (0.1M) were charged, and heating was performed while stirring in an inert gas ($N_2$) atmosphere at 280° C. for 35 minutes.

The resultant reaction solution was subjected to a measurement using the spectrofluorometer. Thus, a fluorescence wavelength of approximately 459.0 nm and a fluorescence FWHM of approximately 45.2 nm were obtained as optical properties Comparative Example 2

Into a 100 mL reaction vessel, 20 mL of a Se-ODE solution (0.1M) was charged, and heating was performed while stirring in an inert gas ($N_2$) atmosphere at 260° C. for 3 minutes.

To this solution, 1.67 mL of a zinc oleate: Zn(OLAc)$_2$-ODE solution (0.4M) was added, and heating was performed while stirring at 240° C. for 30 minutes.

The resultant reaction solution was subjected to a measurement using the spectrofluorometer. Thus, a fluorescence wavelength of approximately 461.0 nm and a fluorescence FWHM of approximately 65.8 nm were obtained as optical properties.

EXAMPLE 14

Into a 100 mL reaction vessel, 183 mg of anhydrous copper acetate: Cu(OAc)$_2$, 0.66 mL of ole lamine: OLAm, 0.64 mL of octanoic acid, and 8.7 mL of octadecene: ODE were charged. Heating was then performed while stirring in an inert gas ($N_2$) atmosphere, thereby dissolving the raw materials.

To this solution, 2.5 mL of a trioctylphosphine selenide: Se-TOP solution (0.2M) was added, and heating was performed while stirring at 230° C. for 120 minutes.

The resultant reaction solution was subjected to a measurement using the spectrofluorometer. Thus, a fluorescence wavelength of approximately 406.5 nm and a fluorescence FWHM of approximately 20.8 nm were obtained as optical properties.

EXAMPLE 15

Into a 100 mL reaction vessel, 141 mg of octanoic acid zinc and 20 mL of octadecene: ODE were charged. Heating was then performed while stirring in an inert gas ($N_2$) atmosphere, thereby dissolving the raw materials.

To this solution, 0.2 mL of a tributylphosphine selenide: Se-TBP solution (0.2M) was added, and heating was performed while stirring at 280° C. for 30 minutes.

The resultant reaction solution was subjected to a measurement using the spectrofluorometer. Thus, a fluorescence wavelength of approximately 415.0 nm and a fluorescence FWHM of approximately 22.5 nm were obtained as optical properties.

TABLE 1

| Example | Raw material for synthesis | | $Cu_2Se$ Synthesis conditions | ZnSe Synthesis conditions | Fluorescence wavelength (nm) | Fluorescence FWHM (nm) |
|---|---|---|---|---|---|---|
| 1 | Cu(acac)$_2$ | 131 mg | 220° C. | 220° C. | | |
| | DDT | 1.5 mL | 10 min | 30 min | | |
| | OLAm | 4.75 mL | | | | |
| | ODE | 6.25 mL | | | | |
| | Se-DDT/OLAm | 1.75 mL | | | | |
| | ZnCl$_2$ | 682 mg | | | | |
| | TOP | 10 mL | | | | |
| | OLAm | 0.4 mL | | | | |
| | ZnSe-ODE | 14 mL | | 280° C. | 446.0 | 16.6 |
| | ZnCl$_2$ | 682 mg | | 120 min | | |
| | TOP | 5 mL | | | | |
| | OLAm | 0.5 mL | | | | |
| 2 | Cu(OAc)$_2$ | 36.3 mg | 200° C. | 230° C. | 445.5 | 23.0 |
| | Se-DDT/OLAm | 0.4 mL | 10 min | 30 min | | |
| | DDT | 0.3 mL | | | | |
| | ODE | 10 mL | | | | |

TABLE 1-continued

| Example | Raw material for synthesis | | Cu$_2$Se Synthesis conditions | ZnSe Synthesis conditions | Fluorescence wavelength (nm) | Fluorescence FWHM (nm) |
|---|---|---|---|---|---|---|
| 3 | ZnCl$_2$ | 273 mg | | | | |
| | TOP | 3 mL | | | | |
| | OLAm | 0.1 mL | | | | |
| | Cu(acac)$_2$ | 131 mg | 200° C. | 230° C. | 454.0 | 19.7 |
| | DDT | 1.5 mL | 20 min | 60 min | | |
| | OLAm | 4.75 mL | | | | |
| | ODE | 6.25 mL | | | | |
| | Se-DDT/OLAm | 1 mL | | | | |
| | S-DDT/OLAm | 1 mL | | | | |
| | ZnCl$_2$ | 682 mg | | | | |
| | OLAm | 0.4 mL | | | | |
| 4 | Cu(OLAc)$_2$ | 1.2 mL | 200° C. | 200° C. | 434.0 | 23.49 |
| | Se-ODE | 3 mL | 60 min | 20 min | | |
| | DDT | 0.4 mL | | | | |
| | ODE | 3 mL | | | | |
| | ZnCl$_2$ | 940 mg | | | | |
| | TOP | 5 mL | | | | |
| | OLAm | 1.0 mL | | | | |

TABLE 2

| Example | Raw material for synthesis | | Cu$_2$Se Synthesis conditions | ZnSe Synthesis conditions | Fluorescence wavelength (nm) | Fluorescence FWHM (nm) |
|---|---|---|---|---|---|---|
| 5 | Cu(OLAc)$_2$ | 543 mg | 220° C. | 220° C. | | |
| | DDT | 9 mL | 10 min | 30 min | | |
| | OLAm | 28.5 mL | | | | |
| | ODE | 37.5 mL | | | | |
| | Se-DDT/OLAm | 10.5 mL | | | | |
| | ZnCl$_2$ | 4092 mg | | | | |
| | TOP | 60 mL | | | | |
| | OLAm | 2.4 mL | | | | |
| | ZnCl$_2$ | 4092 mg | | 280° C. | | |
| | TOP | 30 mL | | 120 min | | |
| | OLAm | 3 mL | | | | |
| | S-DDT/OLAm | 15 mL | | 220° C. | | |
| | | | | 30 min | | |
| | ZnCl$_2$ | 2052 mg | | 230° C. | 445.5 | 13.3 |
| | TOP | 36 mL | | 60 min | | |
| | OLAm | 1.2 mL | | | | |
| 6 | Cu(OLAc)$_2$ | 543 mg | 220° C. | 220° C. | | |
| | DDT | 9 mL | 10 min | 30 min | | |
| | OLAm | 9 mL | | | | |
| | ODE | 57 mL | | | | |
| | Se-DDT/OLAm | 10.5 mL | | | | |
| | ZnCl$_2$ | 4092 mg | | | | |
| | TOP | 60 mL | | | | |
| | OLAm | 2.4 mL | | | | |
| | ZnCl$_2$ | 6150 mL | | 280° C. | | |
| | TOP | 30 mL | | 60 min | | |
| | OLAm | 3 mL | | | | |
| | S-DDT/OLAm | 15 mL | | 220° C. | | |
| | | | | 30 min | | |
| | ZnCl$_2$ | 2052 mg | | 230° C. | 436.0 | 15.2 |
| | TOP | 36 mL | | 60 min | | |
| | OLAm | 1.2 mL | | | | |

TABLE 3

| Example | Raw material for synthesis | | Cu$_2$Se Synthesis conditions | ZnSe Synthesis conditions | Fluorescence wavelength (nm) | Fluorescence FWHM (nm) |
|---|---|---|---|---|---|---|
| 7 | Cu(OLAc)$_2$ | 546 mg | 220° C. | 220° C. | | |
| | DDT | 9 mL | 10 min | 30 min | | |
| | OLAm | 9 mL | | | | |

TABLE 3-continued

| Example | Raw material for synthesis | | Cu$_2$Se Synthesis conditions | ZnSe Synthesis conditions | Fluorescence wavelength (nm) | Fluorescence FWHM (nm) |
|---|---|---|---|---|---|---|
| | ODE | 57 mL | | | | |
| | Se-DDT/OLAm | 8.4 mL | | | | |
| | ZnCl$_2$ | 4092 mg | | | | |
| | TOP | 60 mL | | | | |
| | OLAm | 2.4 mL | | | | |
| | ZnCl$_2$ | 4092 mg | | 280° C. 30 min | | |
| | TOP | 30 mL | | | | |
| | OLAm | 3 mL | | | | |
| | S-DDT/OLAm | 15 mL | | 220° C. 30 min | | |
| | ZnCl$_2$ | 2052 mg | | 230° C. 60 min | 432.0 | 15.3 |
| | TOP | 36 mL | | | | |
| | OLAm | 1.2 mL | | | | |
| 8 | Cu(OLAc)$_2$ | 72.6 mg | 145° C. 30 min | 220° C. 30 min | | |
| | OLAm | 0.263 mL | | | | |
| | ODE | 10 mL | | | | |
| | Se-DDT/OLAm | 2 mL | | | | |
| | ZnCl$_2$ | 546 mg | | | | |
| | TOP | 5 mL | | | | |
| | OLAm | 0.1 mL | | | | |
| | ZnCl$_2$ | 546 mL | | 280° C. 30 min | | |
| | TOP | 5 mL | | | | |
| | OLAm | 0.1 mL | | | | |
| | S-DDT/OLAm | 2 mL | | 220° C. 30 min | | |
| | ZnCl$_2$ | 274 mg | | 230° C. 60 min | 425.5 | 22.1 |
| | TOP | 6 mL | | | | |
| | OLAm | 0.2 mL | | | | |

TABLE 4

| Example | Raw material for synthesis | | Cu$_2$Se Synthesis conditions | ZnSe Synthesis conditions | Fluorescence wavelength (nm) | Fluorescence FWHM (nm) |
|---|---|---|---|---|---|---|
| 9 | Cu(OLAc)$_2$ | 182 mg | 220° C. 20 min | 220° C. 30 min | | |
| | DDT | 3 mL | | | | |
| | OLAm | 9.5 mL | | | | |
| | ODE | 12.5 mL | | | | |
| | Se-DDT/OLAm | 2 mL | | | | |
| | Se-ODE | 8 mL | | | | |
| | ZnCl$_2$ | 1364 mg | | | | |
| | TOP | 20 mL | | | | |
| | OLAm | 0.8 mL | | | | |
| | ZnCl$_2$ | 2050 mg | | 280° C. 120 min | 452.5 | 16.2 |
| | TOP | 10 mL | | | | |
| | OLAm | 1 mL | | | | |
| 10 | Addition to Example 6 | | | 220° C. 5 min | | |
| | DDA | 0.6 mL | | | | |
| | S-ODE | 6 mL | | 220° C. 20 min | 436.0 | 14.7 |
| | Zinc octanoate solution | 12 mL | | 200° C. 30 min | | |

TABLE 5

| Example | Raw material for synthesis | | Cu$_2$Se Synthesis conditions | ZnSe Synthesis conditions | Fluorescence wavelength (nm) | Fluorescence FWHM (nm) |
|---|---|---|---|---|---|---|
| 11 | Addition to Example 6 (100 mL) | | | 220° C. 5 min | | |
| | DDA | 1 mL | | | | |

TABLE 5-continued

| Example | Raw material for synthesis | | Cu₂Se Synthesis conditions | ZnSe Synthesis conditions | Fluorescence wavelength (nm) | Fluorescence FWHM (nm) |
|---|---|---|---|---|---|---|
| | S-DDT/OLAm | 10 mL | | 220° C. 20 min | 436.0 | 15.1 |
| | Zinc octanoate solution | 20 mL | | 200° C. 30 min | | |
| 12-1 | Addition to Example 5 (10 mL) | | | 320° C. 3 min | | |
| | OLAm | 0.75 mL | | | | |
| | Zinc oleate solution | 5 mL | | 220° C. 30 min | 445.5 | 22.5 |
| | DDT | 0.375 mL | | | | |

TABLE 6

| Example | Raw material for synthesis | | Cu₂Se Synthesis conditions | ZnSe Synthesis conditions | Fluorescence wavelength (nm) | Fluorescence FWHM (nm) |
|---|---|---|---|---|---|---|
| 12-2 | Addition to Example 6 (12.5 mL) | | | 320° C. 3 min | | |
| | OLAm | 0.75 mL | | | | |
| | Zinc oleate solution | 5 mL | | 220° C. 30 min | 431.0 | 18.0 |
| | DDT | 0.375 mL | | | | |
| 12-3 | Addition to Example 7 (10 mL) | | | 320° C. 3 min | | |
| | OLAm | 0.75 mL | | | | |
| | Zinc oleate solution | 5 mL | | 220° C. 30 min | 432.0 | 21.0 |
| | DDT | 0.375 mL | | | | |
| 13 | Addition to Example 7 (10 mL) | | | 280° C. 3 min | | |
| | Ethanol | | | | | |
| | Zinc oleate solution | 5 mL | | 220° C. 120 min | 430.0 | 16.0 |
| | DDT | 0.375 mL | | | | |

TABLE 7

| Example | Raw material for synthesis | | Synthesis conditions | Fluorescence wavelength (nm) | Fluorescence FWHM (nm) |
|---|---|---|---|---|---|
| 14 | Cu(OLAc)₂ | 183 mg | 230°C. 120 min | 406.5 | 20.8 |
| | OLAm | 0.66 mL | | | |
| | Octanoic acid | 0.64 mL | | | |
| | ODE | 8.7 mL | | | |
| | Se-TOP | 2.5 mL | | | |
| 15 | Zinc octanoate | 141 mg | 280°C. 30 min | 415.0 | 22.5 |
| | ODE | 20 mL | | | |
| | Se-TBP | 0.2 mL | | | |

TABLE 8

| Example | Fluorescence wavelength (nm) | Fluorescence FWHM (nm) | Quantum yield (%) |
|---|---|---|---|
| 1 | 446.0 | 16.6 | 31 |
| 2 | 445.5 | 23.0 | |
| 3 | 454.0 | 19.7 | |
| 4 | 434.0 | 23.5 | |
| 5 | 445.5 | 13.3 | 52 |
| 6 | 436.0 | 15.2 | 66 |
| 7 | 432.0 | 15.3 | 70 |
| 8 | 425.5 | 22.1 | 63 |
| 9 | 452.5 | 16.2 | 25 |
| 10 | 436.0 | 14.7 | 58 |
| 11 | 436.0 | 15.1 | 48 |
| 12-1 | 445.5 | 22.5 | 3 |
| 12-2 | 431.0 | 18.0 | 9 |
| 12-3 | 432.0 | 21.0 | 23 |
| 13 | 430.0 | 16.0 | 54 |

As shown in Table 8, in each Example, the fluorescence FWHM was 25 nm or less. Further, it was found that the fluorescence FWHM could be controlled to 20 nm or less, and the fluorescence FWHM could be further controlled to 17 nm or less.

As shown in Table 8, the fluorescence wavelength was found to be possibly adjusted within a range of 410 nm to 470 nm. Moreover, it was found that the fluorescence wavelength could be adjusted within a range of 430 nm to 470 nm, and could further be adjusted within a range of 440 nm to 460 nm.

Figure 11:
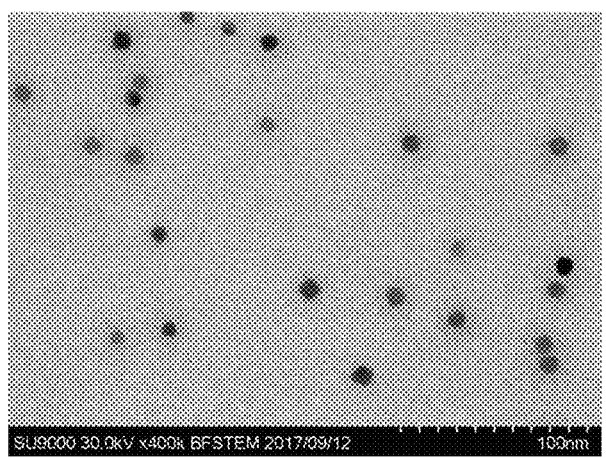
FIG. 11 is a photograph of ZnSe in Example 1, taken by scanning electron microscopy (SEM)

Further, the dispersion solution of ZnSe particles in Example 1 was subjected to measurements using the scanning electron microscope (SEM) and the X-ray diffraction (XRD) system. FIG. 11 shows the result of the measurement using the scanning electron microscope (SEM), and FIG. 12 shows the result of the measurement using the X-ray diffraction (XRD) system.

The dispersion solution of $Cu_2Se$ particles in Example 1 was subjected to a measurement using the scanning electron microscope (SEM). The result is shown in FIG. 13.

Figure 13:
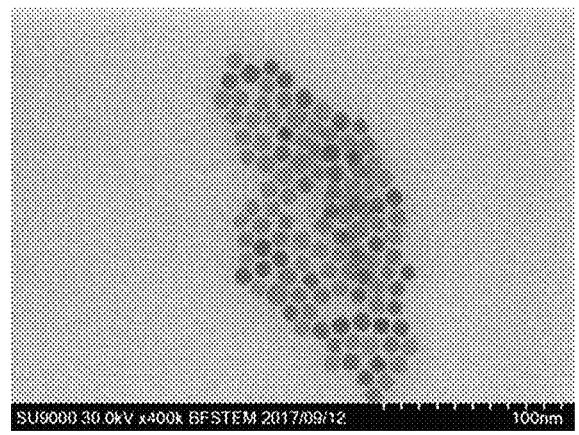
FIG. 13 is a SEM photograph of $Cu_2Se$ in Example 1.

As shown in FIG. 11 and FIG. 13, the ZnSe particles as quantum dots and $Cu_2Se$ as the precursor were found to have been formed to be substantially uniform in particle diameter.

Figure 12:
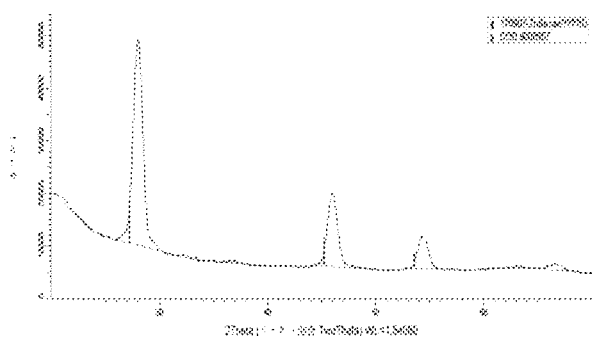
FIG. 12 shows an X-ray diffraction (XRD) spectrum exhibited by ZnSe in Example 1.

Further, the peak value of the XRD spectrum for ZnSe shown in FIG. 12 proved that a ZnSe solid solution was formed.

INDUSTRIAL APPLICABILITY

According to the present invention, quantum dots exhibiting blue phosphorescence can be obtained. By applying quantum dots of the present invention to LEDs, back light units, display devices, etc., excellent emission properties can be obtained in those devices.

This application is based on Japanese patent application No. 2017-198667 filed on Oct. 12, 2017, the content of which is hereby incorporated in its entirety.

The invention claimed is:

1. A method of producing a quantum dot having a core, the method comprising:
   forming the core by:
     synthesizing copper chalcogenide, as a precursor, from an organic copper compound or an inorganic copper compound, and an organic selenium compound;
     performing metal exchange between copper in the copper chalcogenide precursor and zinc; and
     synthesizing the core, which is free of cadmium and contains at least zinc and selenium,
   wherein the organic selenium compound comprises a solution comprising selenium and a mixture of oleylamine and dodecanethiol, and
   wherein selenium is dissolved in the mixture.

2. The method according to claim 1, wherein the quantum dot is a nanocrystal containing zinc and selenium, or zinc and selenium and sulfur.

3. The method according to claim 1, wherein a fluorescence wavelength of the quantum dot is 410 nm or more and 470 nm or less.

4. The method according to claim 1, wherein ligands are placed on a surface of the quantum dot.

5. The method according to claim 4, wherein the ligands are comprised of at least one selected from aliphatic amines, phosphines, and aliphatic carboxylic acids.

6. The method according to claim 1, wherein the metal exchange reaction is performed at 180° C. or more and 280° C. or less.

7. The method according to claim 1, wherein the copper chalcogenide is synthesized at a reaction temperature of 140° C. or more and 250° C. or less.

8. The method according to claim 2, wherein the quantum dot has a core-shell structure in which the nanocrystal serves as a core and a surface of the core is coated with a shell.

9. The method according to claim 1, wherein an amount of copper remaining in the core is 100 ppm or less.

* * * * *